(12) United States Patent
Chen et al.

(10) Patent No.: US 10,149,538 B2
(45) Date of Patent: Dec. 11, 2018

(54) SLIDE RAIL MECHANISM

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Chien-Li Huang, Kaohsiung (TW); Chun-Chiang Wang, Kaohsiung (TW)

(73) Assignees: King Slide Works Co., Ltd., Kaohsiung (TW); King Slide Technology Co., Ltd., Kaohsiung (TW)

( * ) Notice: Subject to any disclaimer, the term of this patent is extended or adjusted under 35 U.S.C. 154(b) by 0 days.

(21) Appl. No.: 15/686,559

(22) Filed: Aug. 25, 2017

(65) Prior Publication Data

US 2018/0168341 A1 Jun. 21, 2018

(30) Foreign Application Priority Data

Dec. 16, 2016 (TW) .............................. 105142137 A

(51) Int. Cl.
| | |
|---|---|
| *A47B 88/00* | (2017.01) |
| *A47B 88/43* | (2017.01) |
| *H05K 7/14* | (2006.01) |
| *A47B 88/427* | (2017.01) |
| *A47B 96/07* | (2006.01) |
| *A47B 96/14* | (2006.01) |

(52) U.S. Cl.
CPC ............ *A47B 88/43* (2017.01); *A47B 88/427* (2017.01); *H05K 7/1489* (2013.01); *A47B 96/07* (2013.01); *A47B 96/1458* (2013.01)

(58) Field of Classification Search
CPC .............................. A47B 88/43; H05K 7/1489
See application file for complete search history.

(56) References Cited

U.S. PATENT DOCUMENTS

| | | | | |
|---|---|---|---|---|
| 6,230,903 B1* | 5/2001 | Abbott | ..................... | H05K 7/14 211/26 |
| 8,028,965 B2* | 10/2011 | Chen et al. | ............ | A47B 63/00 248/298.1 |
| 9,144,173 B2* | 9/2015 | Chen et al. | .............. | A47B 7/00 |
| 9,370,120 B2 | 6/2016 | Chen et al. | | |
| 9,375,087 B1* | 6/2016 | Chen et al. | ............ | A47B 88/00 |
| 9,504,181 B2* | 11/2016 | Chen et al. | ............ | A47B 63/00 |
| 9,681,573 B2* | 6/2017 | Chen et al. | ............ | E05D 15/08 |
| 2005/0156493 A1* | 7/2005 | Yang et al. | .......... | H05K 7/1489 312/334.5 |
| 2009/0283652 A1* | 11/2009 | Chen et al. | ............ | A47B 96/06 248/298.1 |
| 2010/0072153 A1* | 3/2010 | Chen et al. | ............ | A47B 96/06 211/183 |

(Continued)

*Primary Examiner* — Anita M King
(74) *Attorney, Agent, or Firm* — Rosenberg, Klein & Lee

(57) ABSTRACT

A slide rail mechanism includes a rail, a first supporting member, and a second supporting member. Each of the first supporting member and the second supporting member can be displaced with respect to the rail. A first bracket is disposed at the first supporting member, and a second bracket is disposed at the second supporting member. The first bracket and the second bracket enable the rail to adapt to different pairs of posts of different post spacings.

16 Claims, 9 Drawing Sheets

(56) References Cited

U.S. PATENT DOCUMENTS

| 2014/0217049 A1* | 8/2014 | Chen et al. | A47F 5/10 |
| | | | 211/195 |
| 2015/0201754 A1* | 7/2015 | Chen et al. | A47B 96/06 |
| | | | 248/219.3 |
| 2017/0079427 A1* | 3/2017 | Chen et al. | H05K 7/14 |

\* cited by examiner

SLIDE RAIL MECHANISM

FIELD OF THE INVENTION

The present invention relates to a slide rail mechanism and more particularly to one with two brackets whose positions can be adjusted with respect to a rail.

BACKGROUND OF THE INVENTION

In a rack-based system, a slide rail assembly is generally used to mount an object (e.g., a piece of electronic equipment or its chassis) to two posts of a rack. Such a slide rail assembly typically includes a first rail and a second rail displaceable with respect to the first rail. The first rail is mounted to the two rack posts by two brackets respectively. The second rail supports the object so that the object can be displaced with respect to the first rail, e.g., pulled out of and pushed back into the rack, along with the second rail.

U.S. Pat. No. 8,028,965 B2, for example, discloses an adjustable bracket for a slide assembly, wherein the adjustable bracket includes an outer rail (12), a connecting member (20), and a sliding member (50). The connecting member (20) is connected, e.g., fixedly connected, to one end of the outer rail (12) and is mounted to a first post (90) of a rack. The sliding member (50) is mounted to a second post (90) of the rack and can be adjusted, i.e., displaced, with respect to the outer rail (12) via a fixing base (30). The single adjustable sliding member (50), however, cannot adapt the bracket to a pair of posts when the distance between the posts is greater than what the sliding member (50) can cope with.

U.S. Pat. No. 9,370,120 B2 discloses a slide assembly with a first bracket (28) and an engaging member (58). The first bracket (28) is mounted to a first post (13). The engaging member (58) is mounted to the first bracket (28) by a pin (61) passed through a connecting member (36) and has a fastening portion (62) to be locked to the first post (13). Nonetheless, as market demands and structural/spatial considerations vary, an overly complicated bracket structure for use with slide rails is not always desirable.

The disclosures of the foregoing two patents are incorporated herein by reference.

SUMMARY OF THE INVENTION

One objective of the present invention is to provide a slide rail mechanism having a pair of brackets that can be displaced, and thereby adjusted, with respect to a rail.

Another objective of the present invention is to provide a slide rail mechanism having a bracket including a connecting base with at least one lug.

According to one aspect of the present invention, a slide rail mechanism includes a rail, a first supporting member, and a second supporting member. The first supporting member, at which a first bracket is disposed, can be displaced with respect to the rail from a first position to a second position, and the second supporting member, at which a second bracket is disposed, can be displaced with respect to the rail from a third position to a fourth position. The first bracket and the second bracket define a first distance therebetween when the first supporting member is at the first position and the second supporting member is at the third position. The first bracket and the second bracket define a second distance therebetween when the first supporting member is at the second position and the second supporting member is at the fourth position, wherein the second distance is greater than the first distance.

The first bracket preferably includes a first sidewall and at least one first mounting member adjacent to the first sidewall, wherein the at least one first mounting member is configured to be mounted to a first target member. The second bracket preferably includes a second sidewall and at least one second mounting member adjacent to the second sidewall, wherein the at least one second mounting member is configured to be mounted to a second target member.

The first bracket preferably includes a first sidewall, at least one first mounting member adjacent to the first sidewall, and a first fastener movably connected with respect to the first sidewall, wherein the first fastener can be moved between a closed state and an opened state with respect to the first sidewall.

Preferably, the first fastener has a first fastening portion that is adjacent to the at least one first mounting member when the first fastener is in the closed state and that is away from the at least one first mounting member when the first fastener is in the opened state.

Preferably, the first fastener further includes a first connecting portion generally perpendicularly connected to the first fastening portion and an engaging structure located at the first fastening portion. The first fastening portion is in front of the at least one first mounting member when the first fastener is in the closed state.

Preferably, the first bracket further includes a first elastic member, and the first fastener stays in the closed state responsive to the elastic force of the first elastic member.

Preferably, the slide rail mechanism further includes a supporting rail connected to the backside of the rail and including an upper wall, a lower wall, and an extension wall connected between the upper wall and the lower wall. The upper wall, the lower wall, and the extension wall jointly define a channel. The first supporting member and the second supporting member can be displaced with respect to the rail through the channel.

Preferably, the first supporting member is partially mounted in the channel, and the second supporting member is mounted in the channel via an auxiliary supporting member.

Preferably, the slide rail mechanism further includes a reinforcing member movably connected to the rail and the auxiliary supporting member. The reinforcing member has two opposite sides respectively provided with at least one first supporting wall and at least one second supporting wall. The at least one first supporting wall is supported by the rail while the at least one second supporting wall is supported by the auxiliary supporting member.

Preferably, the at least one second supporting wall of the reinforcing member includes a first wall section and a second wall section bent with respect to the first wall section. The first wall section and the second wall section jointly define an auxiliary channel in which a portion of the second supporting member is mounted.

Preferably, the supporting rail includes a position-limiting portion for setting a limit to the movement of the first supporting member.

Preferably, the second bracket includes a second sidewall, at least one second mounting member adjacent to the second sidewall, and a second fastener movably connected to the second sidewall.

According to another aspect of the present invention, a slide rail mechanism includes a rail, a supporting rail, a first supporting member, and a second supporting member. The supporting rail is connected to the rail and includes a first end portion and an opposite second end portion. The first supporting member, at which a first bracket is disposed, can be displaced with respect to the supporting rail, wherein the first bracket includes at least one first mounting member extending beyond the first end portion of the supporting rail. The second supporting member, at which a second bracket is disposed, can also be displaced with respect to the supporting rail, wherein the second bracket includes at least one second mounting member extending beyond the second end portion of the supporting rail.

According to still another aspect of the present invention, a slide rail mechanism includes a rail and a first bracket. The first bracket is configured for mounting the rail to a first target member and includes a first sidewall, a connecting base adjacent to the first sidewall, and at least one first mounting member connected to the connecting base. The connecting base includes at least one lug to which a first fastener is movably connected. The at least one first mounting member is configured to be mounted to the first target member.

DETAILED DESCRIPTION OF THE INVENTION

Figure 1:
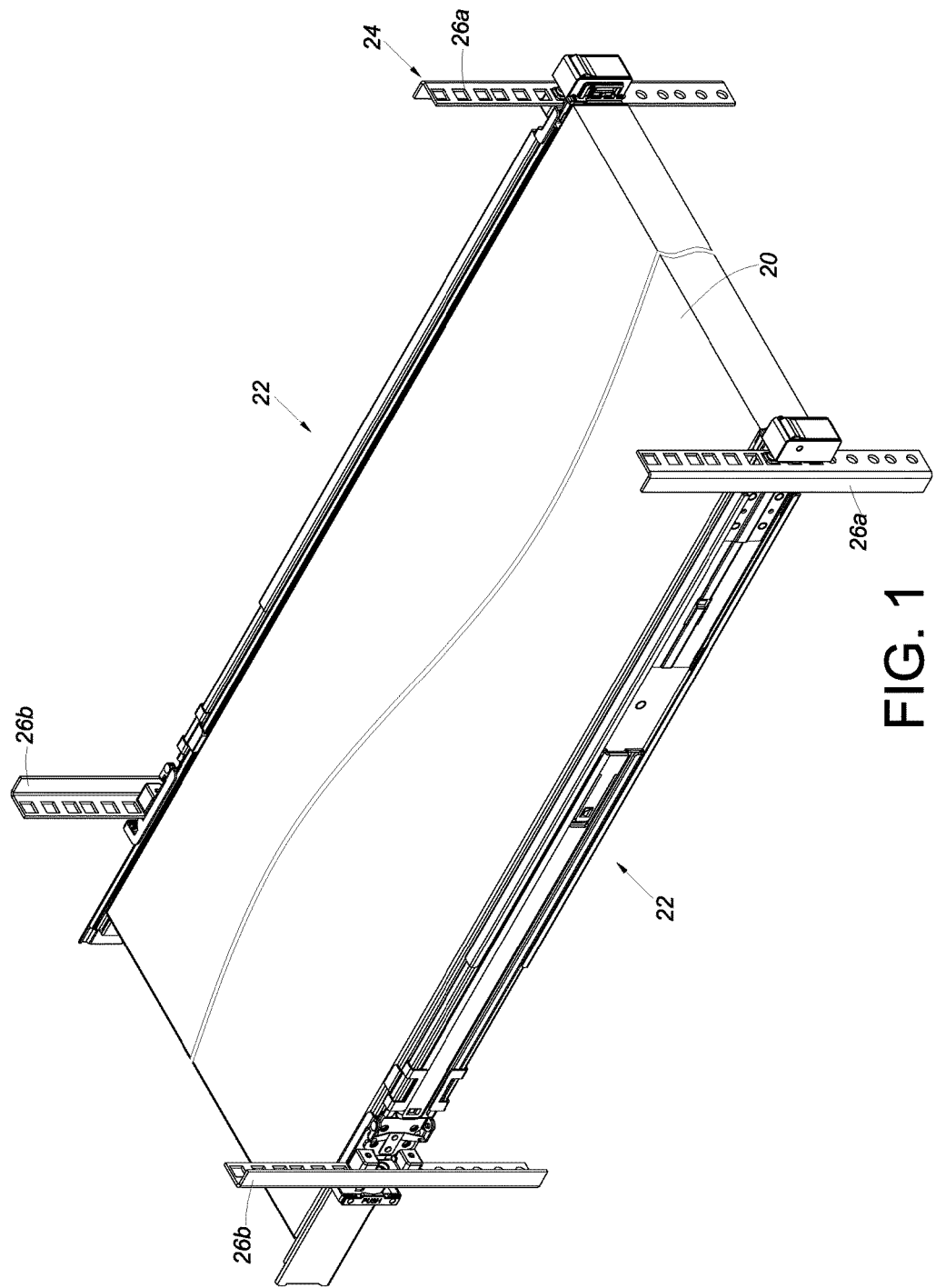
FIG. 1 is a perspective view showing how a slide rail mechanisms mounts an object to a rack in accordance with an embodiment of the present invention.

Referring to FIG. 1, an object 20 such as a piece of electronic equipment is mounted to a rack 24 via a pair of slide rail mechanisms 22. Each of the slide rail mechanisms 22 is mounted on a first post 26a and a second post 26b of the rack 24.

Figure 2:
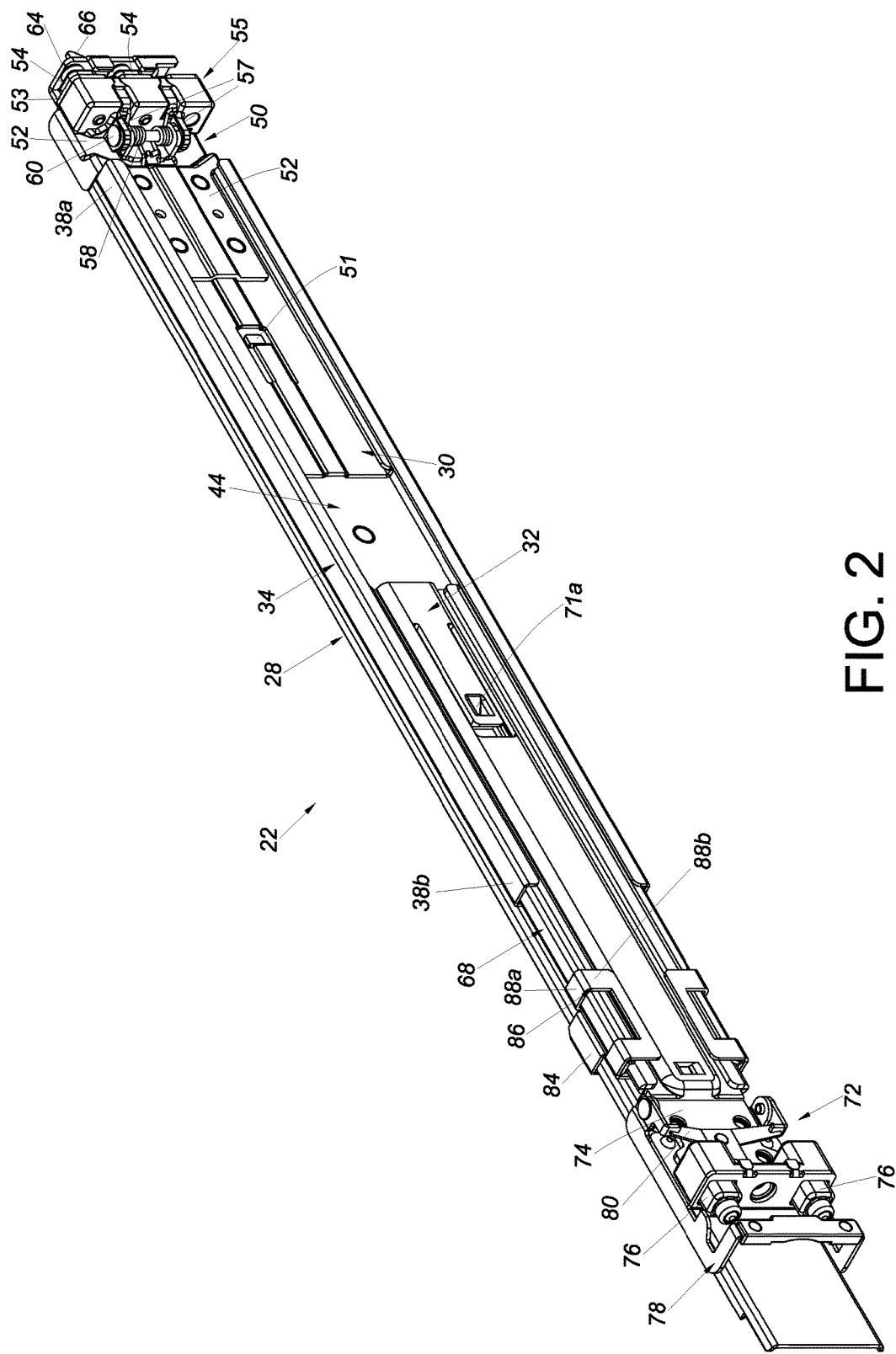
FIG. 2 is a perspective view of the slide rail mechanisms in an embodiment of the present invention.
Figure 3:
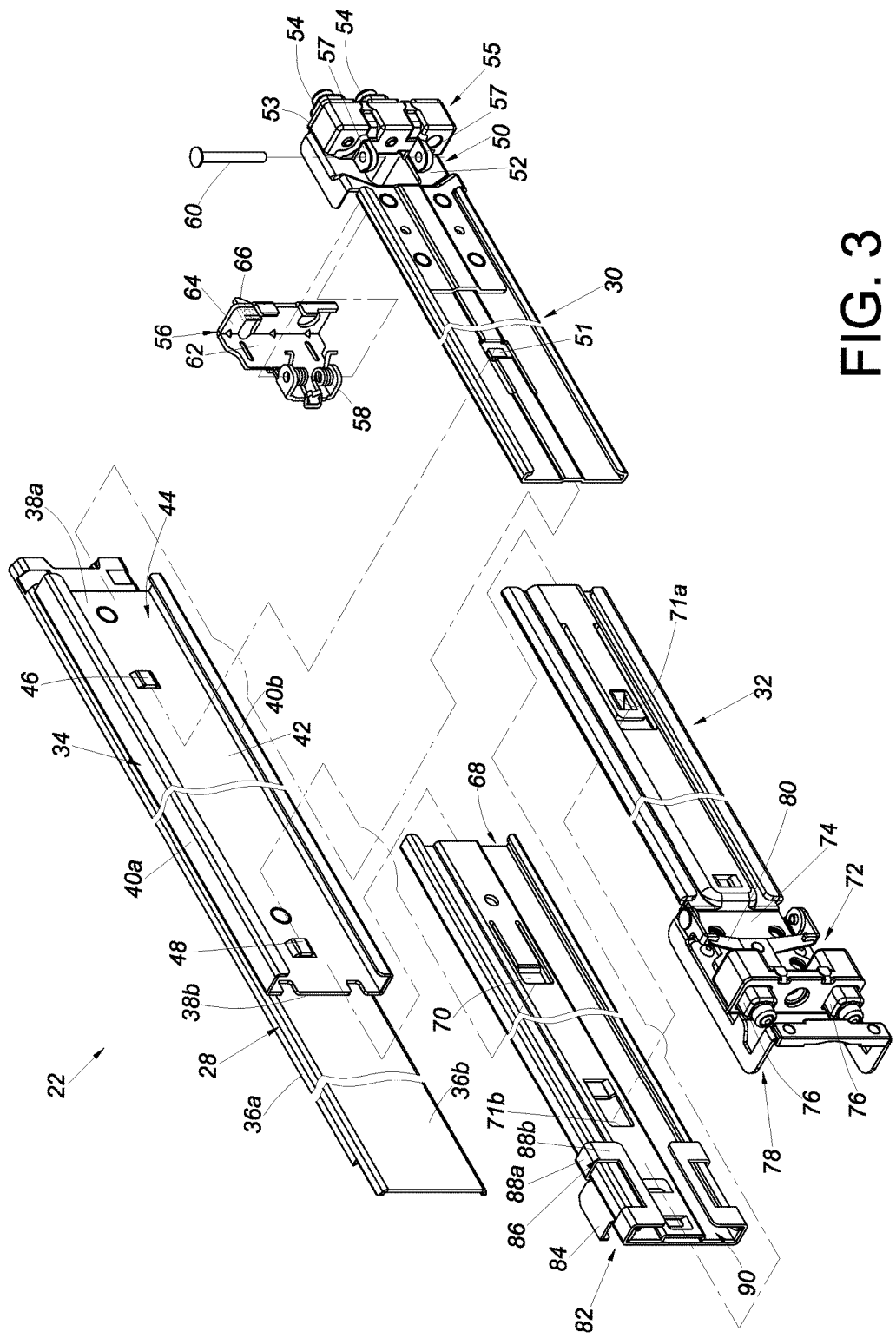
FIG. 3 is an exploded perspective view of the slide rail mechanism in an embodiment of the present invention.

As shown in FIG. 2 and FIG. 3, each slide rail mechanism 22 includes a rail 28, a first supporting member 30, a second supporting member 32, and preferably also a supporting rail 34.

The rail 28 has two opposite sides, namely a front side 36a and a backside 36b. The slide rail mechanism 22 may include other rails mounted on the front side 36a of the rail 28 such that the slide rail mechanism 22 becomes a so-called two- or three-section slide rail. As the structure of such multiple-section slide rails is well known in the art, further description is omitted herein for the sake of brevity.

The supporting rail 34 is connected to the rail 28, e.g., to the backside 36b of the rail 28. The supporting rail 34 may be fixedly connected to the rail 28 by riveting, threaded connection, or soldering and therefore can be viewed as a part of the rail 28. More specifically, the supporting rail 34 includes a first end portion 38a and an opposite second end portion 38b. The supporting rail 34 preferably includes an upper wall 40a, a lower wall 40b, and an extension wall 42 connected between the upper wall 40a and the lower wall 40b. The upper wall 40a, the lower wall 40b, and the extension wall 42 jointly define a channel 44. The supporting rail 34 further includes at least one position-limiting portion in the channel 44. Here, a first position-limiting portion 46 and a second position-limiting portion 48 are provided by way of example. The first position-limiting portion 46 and the second position-limiting portion 48 are formed by the extension wall 42, such as in the form of protrusions.

The first supporting member 30 can be displaced with respect to the rail 28. Here, the first supporting member 30 can be displaced with respect to the rail 28 through the channel 44 of the supporting rail 34. For example, the first supporting member 30 is partially mounted in the channel 44 of the supporting rail 34 and has a first elastic arm 51 corresponding in position to the first position-limiting portion 46 of the supporting rail 34. The first elastic arm 51 can move over the first position-limiting portion 46 and consequently lie between the first position-limiting portion 46 and the second position-limiting portion 48 of the supporting rail 34, serving to set a limit to the movement of the first supporting member 30.

Figure 4:
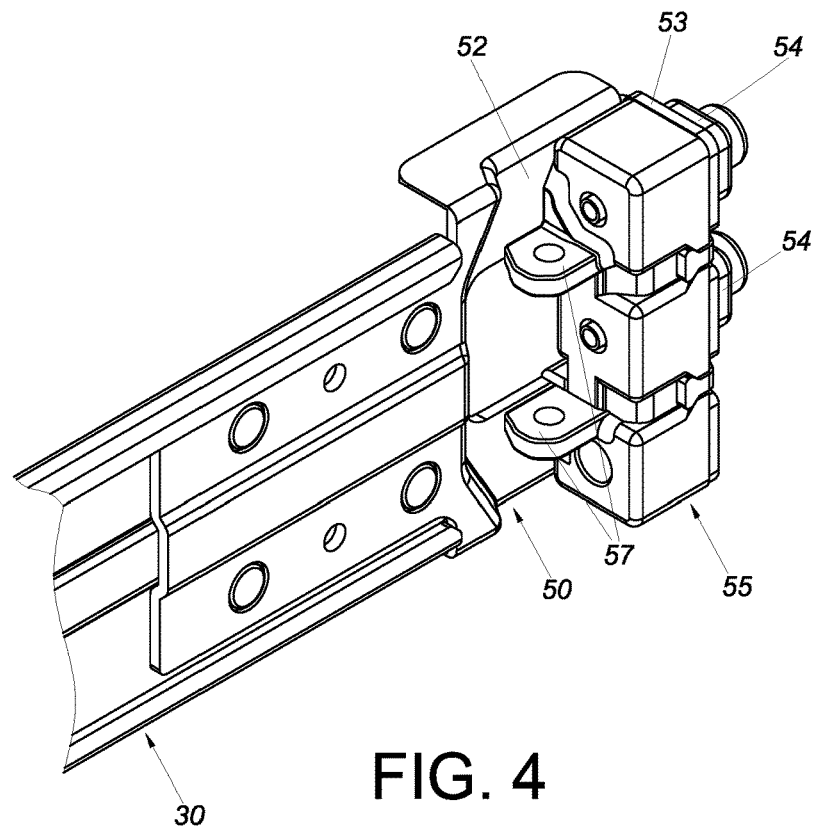
FIG. 4 is a perspective view of a bracket of the slide rail mechanism in an embodiment of the present invention.

More specifically, a first bracket 50 (see FIG. 4) is disposed at the first supporting member 30. The first bracket 50 includes a first sidewall 52, a first end wall 53, at least one first mounting member 54, a connecting base 55, a first fastener 56, and preferably also a first elastic member 58.

Figure 5:
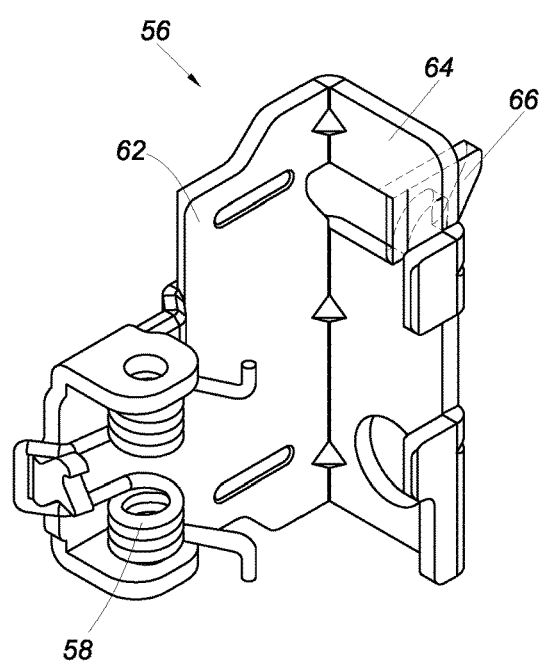
FIG. 5 is a perspective view of a fastener of the bracket in an embodiment of the present invention.

The first sidewall 52 of the first bracket 50 may be fixedly connected to the first supporting member 30 by riveting, threaded connection, or soldering such that the first bracket 50 can be viewed as a part of the first supporting member 30. The first end wall 53 of the first bracket 50 is substantially perpendicularly connected to the first sidewall 52. The connecting base 55 is attached to the first sidewall 52, is adjacent to the first end wall 53, and includes at least one lug 57. To achieve higher structural strength and simplify the structural configuration of the first bracket 50, it is preferable that the connecting base 55 and the at least one lug 57 are integrally formed. The at least one first mounting member 54 is connected to the connecting base 55 and partially extends out of the first end wall 53. Moreover, the at least one first mounting member 54 extends a certain distance beyond the first end portion 38a of the supporting rail 34 and lies outside the channel 44 of the supporting rail 34. The first fastener 56 is movably connected with respect to the first sidewall 52. For example, the first fastener 56 (see FIG. 5) may be pivotally connected to the at least one lug 57 of the connecting base 55 by a first shaft 60. The first fastener 56 includes a first connecting portion 62, a first fastening portion 64 substantially perpendicularly connected to the first connecting portion 62, and an engaging structure 66 located at the first fastening portion 64. Here, the engaging structure 66 is a fastening hook by way of example. Preferably, the first fastener 56 includes metal, and the first connecting portion 62, the first fastening portion 64, and the engaging structure 66 are integrally formed. The first elastic member 58 applies an elastic force to the first fastener 56.

The second supporting member 32 can be displaced with respect to the rail 28. Preferably, the second supporting member 32 can be displaced with respect to the rail 28 through the channel 44 of the supporting rail 34. Here, the second supporting member 32 is mounted in the channel 44 of the supporting rail 34 via an auxiliary supporting member 68, which helps increase the distance for which the second supporting member 32 can be displaced with respect to the rail 28. Preferably, the auxiliary supporting member 68 includes a second elastic arm 70 corresponding in position to the second position-limiting portion 48 of the supporting rail 34. The second elastic arm 70 can move over the second position-limiting portion 48 and consequently lie between the first position-limiting portion 46 and the second position-limiting portion 48 of the supporting rail 34, serving to set a limit to the movement of the auxiliary supporting member 68. Preferably, the second supporting member 32 further includes a first feature 71a, and the auxiliary supporting member 68 further includes a second feature 71b corresponding to the first feature 71a, wherein the features serve position-limiting purposes. For example, the first feature 71a is an elastic plate with a protuberance, the second feature 71b is a hole, and the first feature 71a can engage with and disengage from the second feature 71b. Furthermore, a second bracket 72 is disposed at the second supporting member 32. The second bracket 72 includes a second sidewall 74, at least one second mounting member 76, and a second fastener 78. The second sidewall 74 may be fixedly connected to the second supporting member 32 by riveting, threaded connection, or soldering such that the second bracket 72 can be viewed as a part of the second supporting member 32. The at least one second mounting member 76 is adjacent to the second sidewall 74 and extends a certain distance beyond the second end portion 38b of the supporting rail 34. The second fastener 78 is pivotally connected with respect to the second sidewall 74. Preferably, the second bracket 72 further includes a second elastic member 80 for applying an elastic force to the second fastener 78, wherein the second elastic member 80 may be structured as an elastic plate for example. The second fastener 78 can stay in a closed state with respect to the at least one second mounting member 76 in response to the elastic force of the second elastic member 80.

Preferably, the slide rail mechanism 22 further includes a reinforcing member 82 movably connected to the rail 28 and the auxiliary supporting member 68. More specifically, the reinforcing member 82 includes at least one first supporting wall 84 on one side and at least one second supporting wall 86 on the opposite side. The at least one first supporting wall 84 is supported by the rail 28 while the at least one second supporting wall 86 is supported by the auxiliary supporting member 68. More specifically, the at least one second supporting wall 86 includes a first wall section 88a and a second wall section 88b bent with respect to the first wall section 88a. The first wall section 88a and the second wall section 88b jointly define an auxiliary channel 90, and a portion of the second supporting member 32 extends through and is mounted in the auxiliary channel 90.

Figure 6:
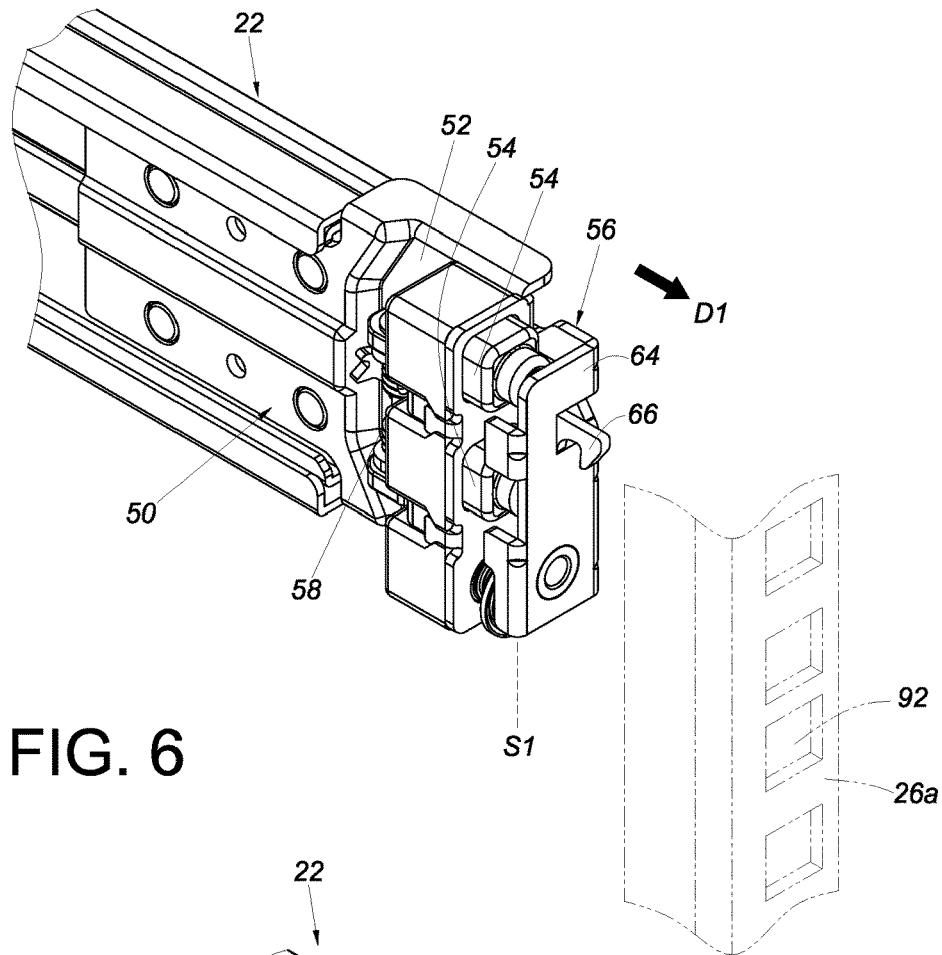
FIG. 6 is a perspective view showing how the bracket is displaced in a certain direction in order to be mounted to a post in accordance with an embodiment of the present invention, with the fastener of the bracket in a closed state.

Referring to FIG. 6, the first fastener 56 of the first bracket 50 is shown in a closed state S1 with respect to the first sidewall 52. More specifically, the first fastener 56 can stay in the closed state S1 in response to the elastic force of the first elastic member 58. In the closed state S1, the first fastening portion 64 of the first fastener 56 is adjacent to the at least one first mounting member 54, and the first fastening portion 64 and/or the engaging structure 66 is in front of the at least one first mounting member 54.

Figure 7:
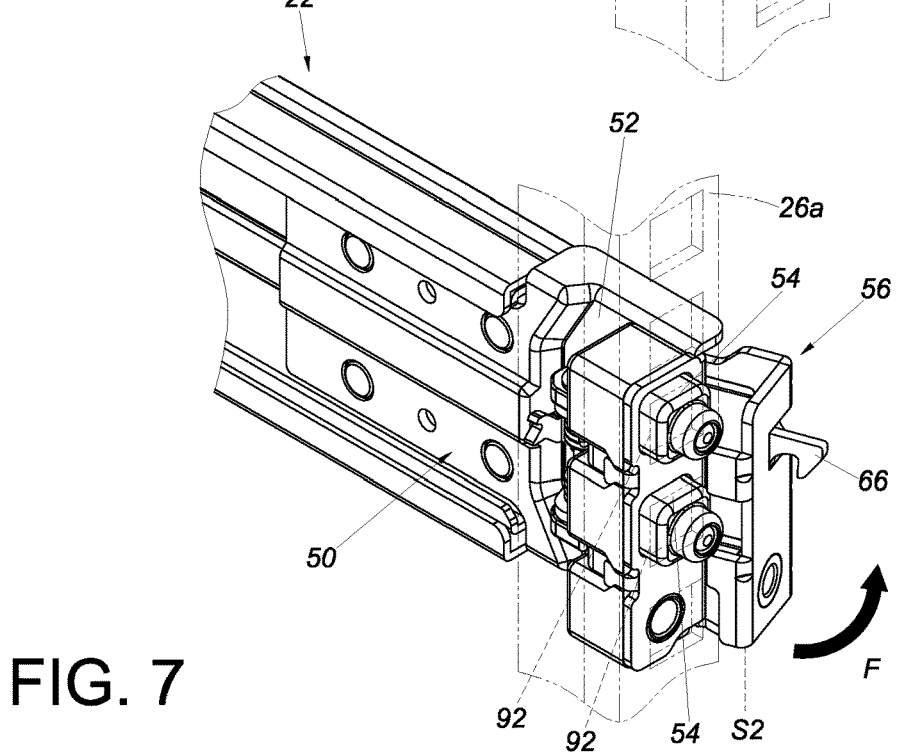
FIG. 7 is a perspective view showing that the at least one mounting member of the bracket enters the at least one hole in the post in accordance with an embodiment of the present invention, with the fastener of the bracket in an opened state.

Referring to FIG. 6 and FIG. 7, when it is desired to mount the slide rail mechanism 22 to the first post 26a (also referred to herein as the first target member), the slide rail mechanism 22 is moved in a first direction D1 toward the first post 26a, and a force F is applied to the first fastener 56 of the first bracket 50 to bring the first fastener 56 from the closed state S1 into an opened state S2 with respect to the first sidewall 52. While the first fastener 56 is in the opened state S2, the first fastening portion 64 and/or the engaging structure 66 of the first fastener 56 is away from the at least one first mounting member 54 so that the at least one first mounting member 54 can be mounted into the at least one hole 92 of the first post 26a.

Figure 8:
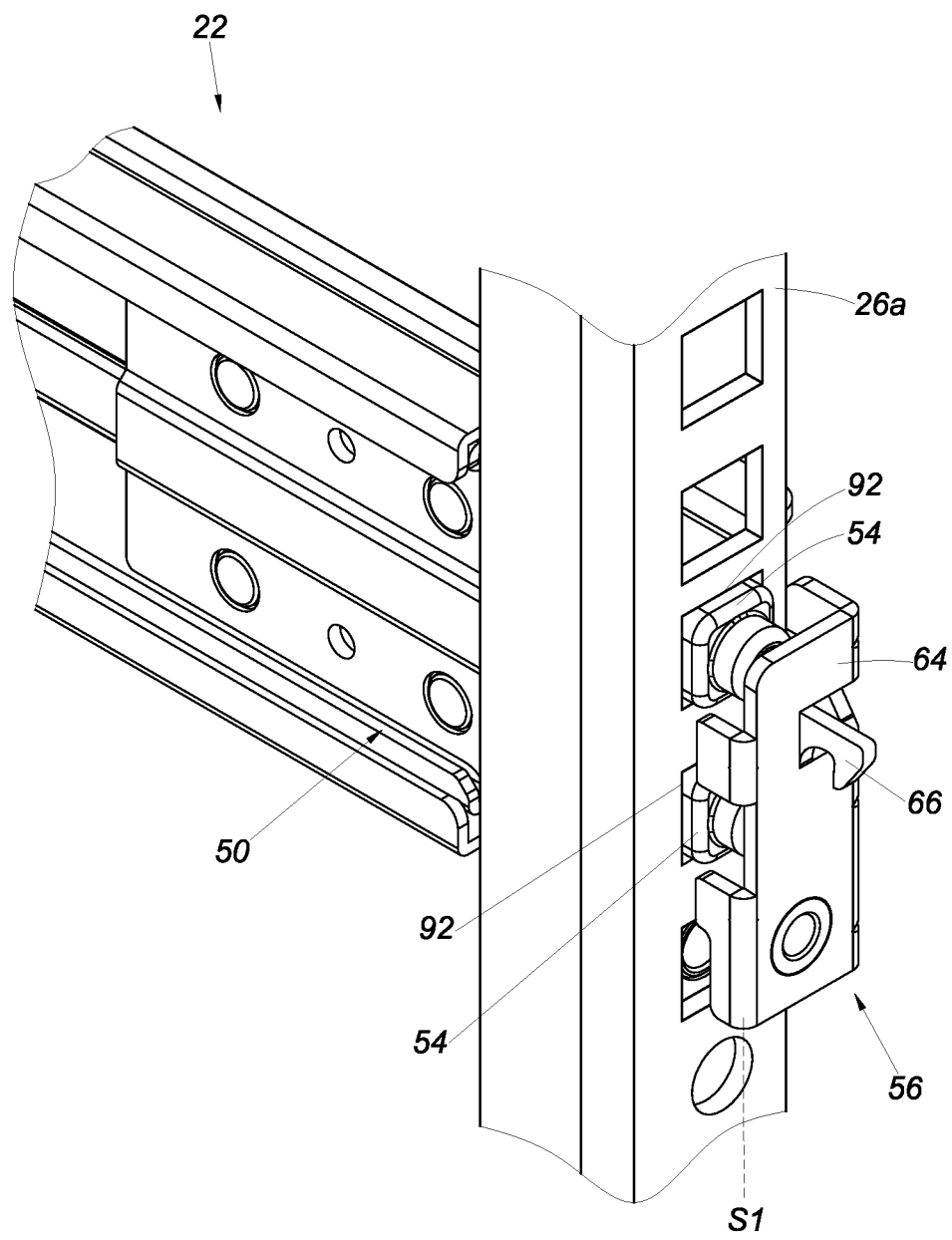
FIG. 8 is a perspective view showing the bracket mounted on the post in accordance with an embodiment of the present invention.

Referring to FIG. 8, once the at least one first mounting member 54 of the first bracket 50 is mounted in the at least one hole 92 of the first post 26a, the first fastener 56 returns to the closed state S1 in response to the elastic force of the first elastic member 58. As a result, the first fastening portion 64 is locked to the first post 26a, and the operation of mounting the first bracket 50 to the first post 26a is completed. The slide rail mechanism 22 can be subsequently mounted to the second post 26b (also referred to herein as the second target member) via the second bracket 72. As the operation of mounting the second bracket 72 to the second post 26b is similar to the operation of mounting the first bracket 50 to the first post 26a, a detailed description of the former is omitted herein for the sake of brevity.

Figure 9:
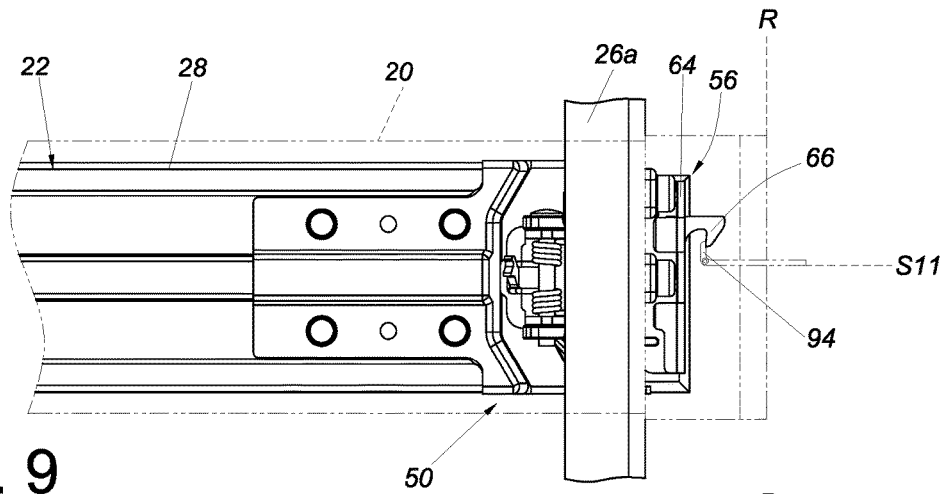
FIG. 9 is a schematic view showing the bracket mounted on the post in accordance with an embodiment of the present invention, in which the engaging structure of the bracket is mounted with an engaging member of an object.

Referring to FIG. 9, the first fastener 56 remains in the closed state S1 after the first bracket 50 is mounted to the first post 26a, in order for a third target member (e.g., the object 20) to detachably engage with the engaging structure 66 of the first fastening portion 64 of the first fastener 56. More specifically, an engaging member 94 is movably mounted on the object 20, and when the object 20 is mounted on the slide rail mechanism 22 and is at a retracted position R, the engaging member 94 of the object 20 is in an engaged state S11, i.e., in engagement with the engaging structure 66, to keep the object 20 at the retracted position R.

Figure 10:
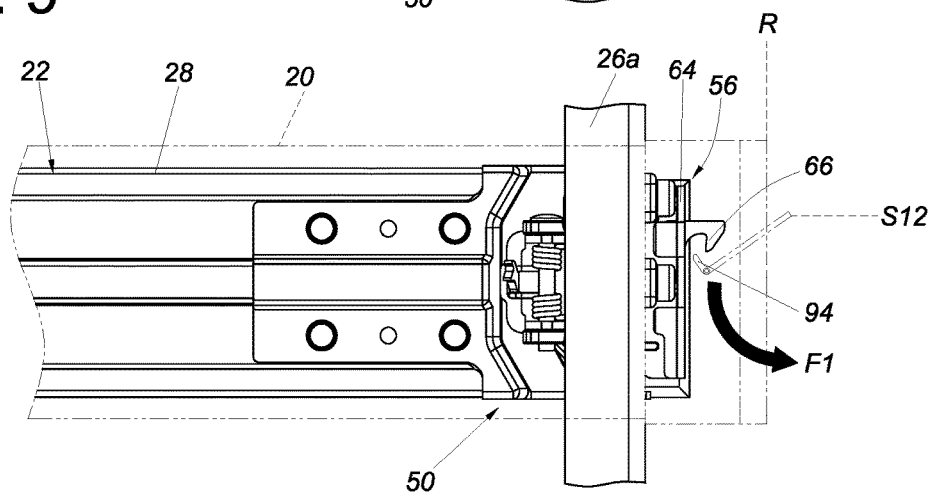
FIG. 10 is a schematic view showing the bracket mounted on the post in accordance with an embodiment of the present invention, in which the engaging member of the object is operated and thus disengaged from the engaging structure of the bracket.
Figure 11:
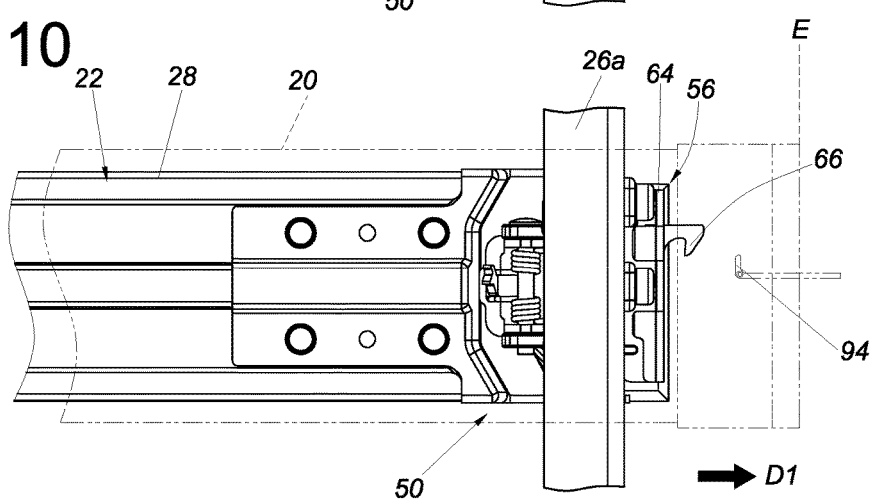
FIG. 11 is a schematic view showing the bracket mounted on the post in accordance with an embodiment of the present invention, in which the engaging member of the object is displaced in a certain direction with respect to the bracket after disengagement from the engaging structure of the bracket.

Referring to FIG. 10 and FIG. 11, a force F1 can be applied to the engaging member 94 to switch it from the engaged state S11 to a disengaged state S12, in which the engaging member 94 is out of engagement with the engaging structure 66 so that the object 20 can be displaced from the retracted position R to an extended position E in the first direction D1.

Figure 12:
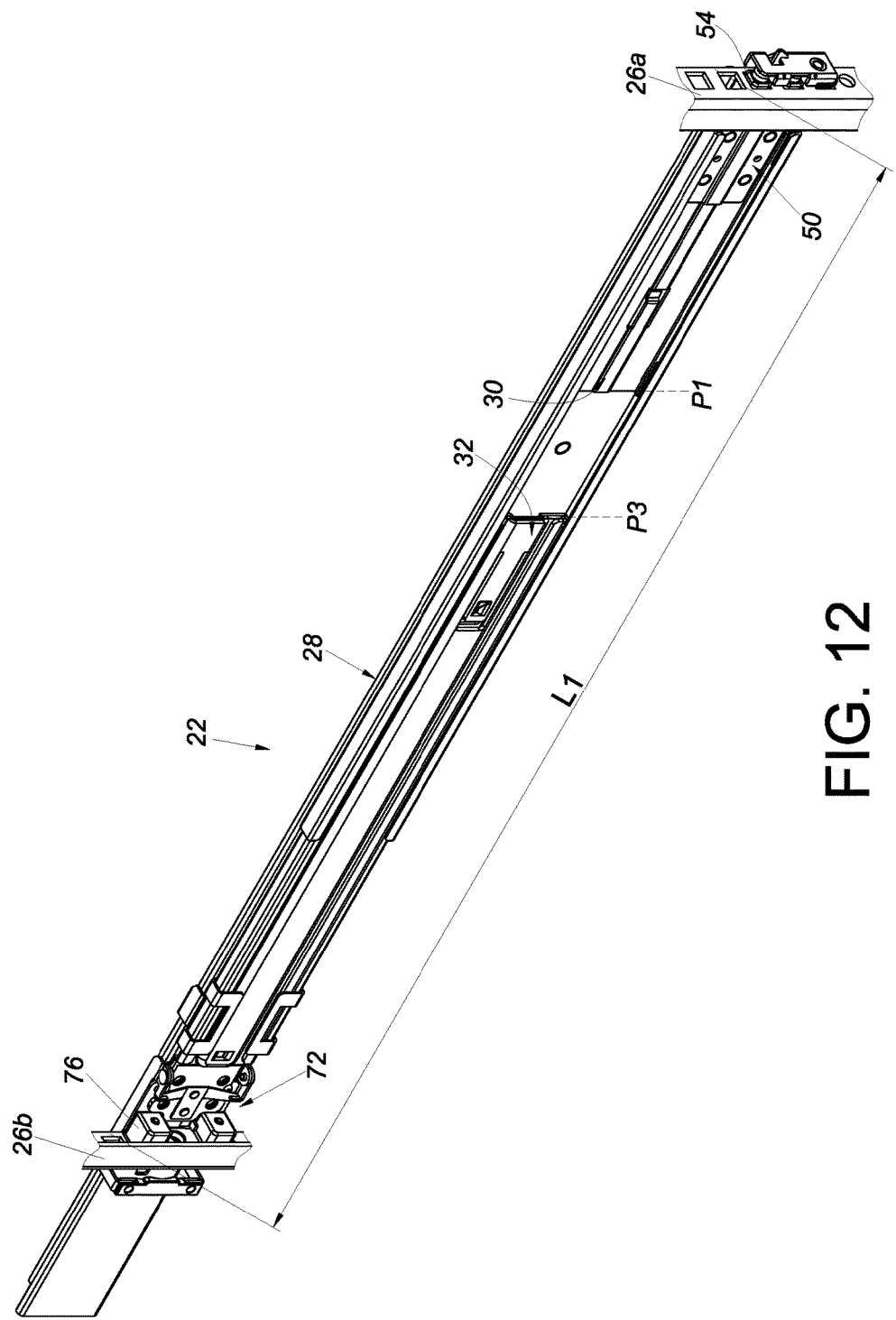
FIG. 12 is a perspective view showing how the slide rail mechanism adapts to a pair of posts having a first distance therebetween in accordance with an embodiment of the present invention.

Referring to FIG. 12, the first bracket 50 and the second bracket 72 define a first distance L1 therebetween when the first supporting member 30 is at a first position P1 with respect to the rail 28 and the second supporting member 32 is at a third position P3 with respect to the rail 28. The slide rail mechanism 22 in this configuration is adapted for a rack of a first specification (e.g., for the rack 24 when the first post 26a and the second post 26b are spaced apart by the first distance L1) and is mounted to the first post 26a via the at least one first mounting member 54 of the first bracket 50 and to the second post 26b via the at least one second mounting member 76 of the second bracket 72.

Figure 13:
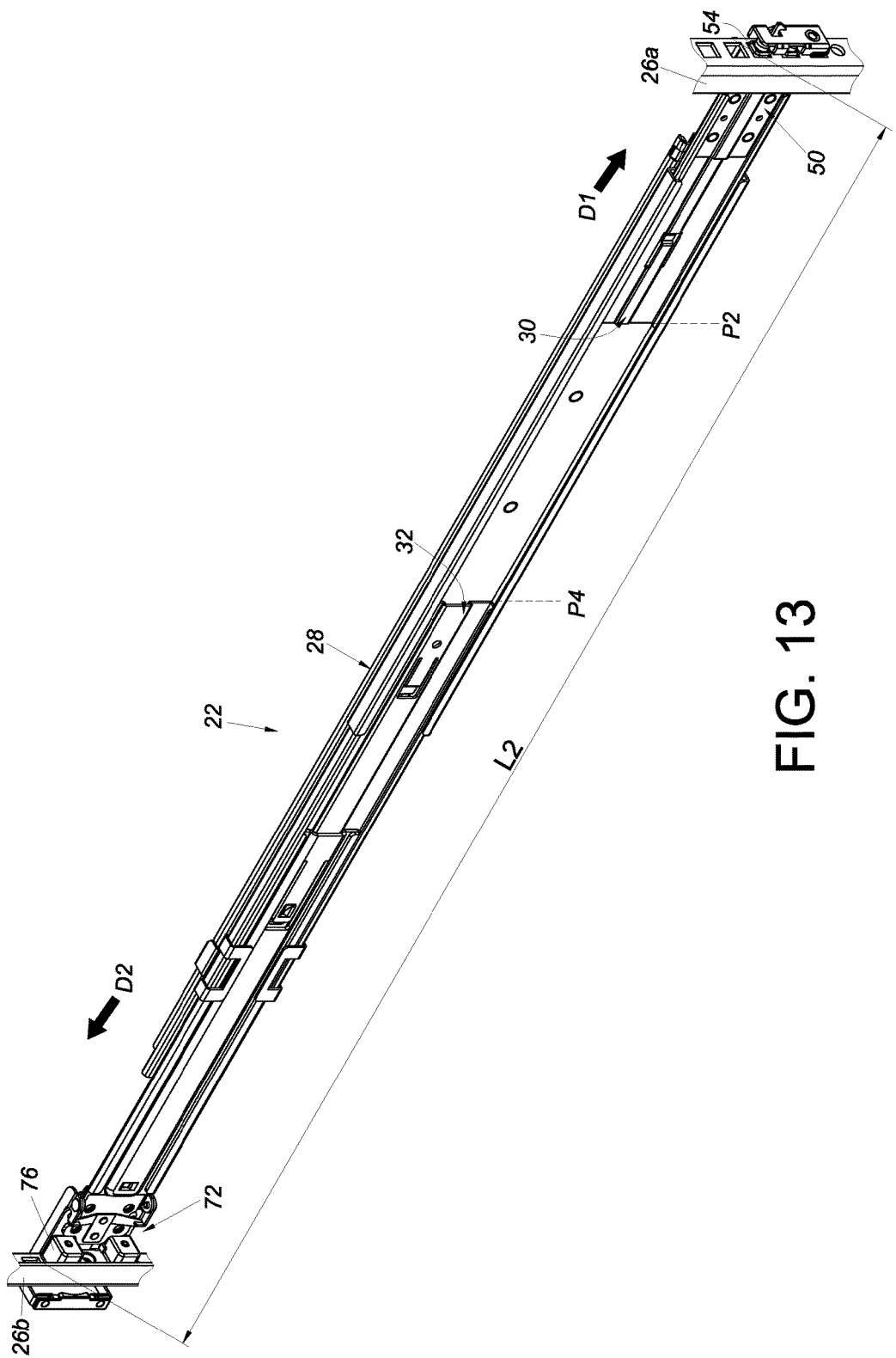
FIG. 13 is a perspective view showing how the slide rail mechanism adapts to a pair of posts having a second distance therebetween in accordance with an embodiment of the present invention.

Referring to FIG. 12 and FIG. 13, once the first supporting member 30 is displaced from the first position P1 to a second position P2 with respect to the rail 28 in the first direction D1 and the second supporting member 32 is displaced from the third position P3 to a fourth position P4 with respect to the rail 28 in a second direction D2, the first bracket 50 and the second bracket 72 define a second distance L2 therebetween, wherein the second distance L2 is greater than the first distance L1 and the second direction D2 is the opposite direction of the first direction D1. The slide rail mechanism 22 in this configuration is adapted for a rack of a second specification (e.g., for the rack 24 when the first post 26a and the second post 26b are spaced apart by the second distance L2) and is mounted to the first post 26a via the at least one first mounting member 54 of the first bracket 50 and to the second post 26b via the at least one second mounting member 76 of the second bracket 72.

It can be known from the above that the slide rail mechanism disclosed herein includes at least one of the following features:
1. Each of the first supporting member (or the first bracket) and the second supporting member (or the second bracket) can be adjusted, i.e., displaced, with respect to the rail to adapt the slide rail mechanism to rack posts of different post spacings.
2. The at least one lug and the connecting base of the first bracket can be integrally formed for higher structural strength and for simplicity of the structural configuration of the first bracket.

While the present invention has been disclosed by way of the embodiment described above, it should be understood that the embodiment is not intended to be restrictive of the scope of the invention. The scope of patent protection sought by the applicant is defined by the appended claims.

What is claimed is:
1. A slide rail mechanism, comprising:
a rail;
a first supporting member displaceable with respect to the rail from a first position to a second position, with a first bracket disposed at the first supporting member;
a second supporting member displaceable with respect to the rail from a third position to a fourth position, with a second bracket disposed at the second supporting member;
wherein the first bracket and the second bracket define a first distance therebetween when the first supporting member is at the first position and the second supporting member is at the third position;
wherein the first bracket and the second bracket define a second distance therebetween when the first supporting member is at the second position and the second supporting member is at the fourth position, and the second distance is greater than the first distance; and
a supporting rail connected to a backside of the rail, wherein the supporting rail includes an upper wall, a lower wall, and an extension wall connected between the upper wall and the lower wall, the upper wall, the lower wall, and the extension wall jointly define a channel, the first supporting member and the second supporting member are displaceable with respect to the rail through the channel.

2. The slide rail mechanism of claim 1, wherein the first bracket includes a first sidewall and at least one first mounting member adjacent to the first sidewall, the at least one first mounting member is configured to be mounted to a first target member, the second bracket includes a second sidewall and at least one second mounting member adjacent to the second sidewall, and the at least one second mounting member is configured to be mounted to a second target member.

3. The slide rail mechanism of claim 1, wherein the first bracket includes a first sidewall, at least one first mounting member adjacent to the first sidewall, and a first fastener movably connected with respect to the first sidewall; the first fastener is movable between a closed state and an opened state with respect to the first sidewall.

4. The slide rail mechanism of claim 3, wherein the first fastener includes a first fastening portion; the first fastening portion is adjacent to the at least one first mounting member when the first fastener is in the closed state; the first fastening portion is away from the at least one first mounting member when the first fastener is in the opened state.

5. The slide rail mechanism of claim 4, wherein the first fastener includes a first connecting portion and an engaging structure; the first connecting portion is substantially perpendicularly connected to the first fastening portion, and the engaging structure is located at the first fastening portion; the first fastening portion is in front of the at least one first mounting member when the first fastener is in the closed state.

6. The slide rail mechanism of claim 3, wherein the first bracket includes a first elastic member, the first elastic member is configured to apply an elastic force responsive to which the first fastener stays in the closed state.

7. The slide rail mechanism of claim 1, wherein the first supporting member is partially mounted in the channel, and the second supporting member is mounted in the channel via an auxiliary supporting member.

8. The slide rail mechanism of claim 7, further comprising a reinforcing member movably connected to the rail and the auxiliary supporting member, wherein the reinforcing member has two opposite sides respectively provided with at least one first supporting wall and at least one second supporting wall, the at least one first supporting wall is supported by the rail, and the at least one second supporting wall is supported by the auxiliary supporting member.

9. The slide rail mechanism of claim 8, wherein the at least one second supporting wall of the reinforcing member includes a first wall section and a second wall section bent with respect to the first wall section, and the first wall section and the second wall section jointly define an auxiliary channel in which a portion of the second supporting member is mounted.

10. The slide rail mechanism of claim 1, wherein the supporting rail includes a position-limiting portion for setting a limit to movement of the first supporting member.

11. The slide rail mechanism of claim 1, wherein the second bracket includes a second sidewall, at least one second mounting member adjacent to the second sidewall, and a second fastener movably connected to the second sidewall.

12. A slide rail mechanism, comprising:
a rail;
a supporting rail connected to the rail, wherein the supporting rail includes a first end portion and an opposite second end portion, the supporting rail being connected to a backside of the rail, the supporting rail including an upper wall, a lower wall, and an extension wall connected between the upper wall and the lower wall, and the upper wall, the lower wall, and the extension wall jointly defining a channel;
a first supporting member displaceable with respect to the supporting rail, with a first bracket disposed at the first supporting member, wherein the first bracket includes at least one first mounting member extending beyond the first end portion of the supporting rail; and
a second supporting member displaceable with respect to the supporting rail, with a second bracket disposed at the second supporting member, wherein the second bracket includes at least one second mounting member extending beyond the second end portion of the supporting rail, the first supporting member and the second supporting member being displaceable with respect to the rail through the channel.

13. The slide rail mechanism of claim 12, wherein the first bracket includes a first sidewall and a first fastener pivotally connected with respect to the first sidewall, the first fastener is movable between a closed state and an opened state with respect to the first sidewall, and the at least one first mounting member is adjacent to the first sidewall.

14. The slide rail mechanism of claim 13, further comprising an engaging structure located at a first fastening portion of the first fastener and a first elastic member for applying an elastic force to the first fastener and thereby keeping the first fastener in the closed state.

15. The slide rail mechanism of claim 12, wherein the first supporting member is partially mounted in the channel, and the second supporting member is mounted in the channel via an auxiliary supporting member.

16. The slide rail mechanism of claim 15, further comprising a reinforcing member movably connected to the rail and the auxiliary supporting member, wherein the reinforcing member has two opposite sides respectively provided with at least one first supporting wall and at least one second supporting wall, the at least one first supporting wall is supported by the rail, the at least one second supporting wall is supported by the auxiliary supporting member, the at least one second supporting wall of the reinforcing member includes a first wall section and a second wall section bent with respect to the first wall section, and the first wall section and the second wall section jointly define an auxiliary channel in which a portion of the second supporting member is mounted.

\* \* \* \* \*